United States Patent [19]
Ito

[11] Patent Number: 5,166,768
[45] Date of Patent: Nov. 24, 1992

[54] COMPOUND SEMICONDUCTOR INTEGRATED CIRCUIT DEVICE WITH AN ELEMENT ISOLATING REGION

[75] Inventor: Kazuhiko Ito, Itami, Japan

[73] Assignee: Mitsubishi Denki Kabushiki Kaisha, Tokyo, Japan

[21] Appl. No.: 631,452

[22] Filed: Dec. 21, 1990

[30] Foreign Application Priority Data

Dec. 25, 1989 [JP] Japan .................. 1-337844

[51] Int. Cl.⁵ .......................................... H01L 27/02
[52] U.S. Cl. ................................ 257/523; 257/272; 257/280
[58] Field of Search ................ 357/22 R, 22 A, 47, 357/63, 64

[56] References Cited

U.S. PATENT DOCUMENTS

| | | | |
|---|---|---|---|
| 4,733,283 | 3/1988 | Kuroda | 357/47 |
| 4,739,379 | 4/1988 | Akagi et al. | 357/47 |
| 4,771,324 | 9/1988 | Odani et al. | 357/22 A |
| 4,956,683 | 9/1990 | Quintana | 357/63 |

FOREIGN PATENT DOCUMENTS

| | | | |
|---|---|---|---|
| 0067419 | 12/1982 | European Pat. Off. | 357/49 |
| 0188897 | 7/1986 | European Pat. Off. | 357/34 |
| 0195460 | 9/1986 | European Pat. Off. | 357/49 |
| 0378894 | 7/1990 | European Pat. Off. | 357/22 |
| 62-274669 | 11/1987 | Japan | 357/22 R |
| 63-129656 | 6/1988 | Japan | 357/47 |
| 63-170938 | 7/1988 | Japan | 357/22 |
| 63-308934 | 12/1988 | Japan | 357/47 |
| 1-46950 | 2/1989 | Japan | 357/47 |
| 1-302742 | 12/1989 | Japan | 357/47 |

OTHER PUBLICATIONS

Clauwaert et al, "Characterization Of Device Isolation In GaAs MESFET Circuits By Boron Implantation", Journal of Electrochemical Society, vol. 134, No. 3, 1987, pp. 711-714.

Ishizuka et al, "Active Area Limitation Of Ge/GaAs Heterojunctions By Means Of B Ion Implantation", Journal of Applied Physics, vol. 59, No. 2, 1986, pp. 495-497.

Short et al, "Implant Isolation Of GaAs", Journal of the Electrochemical Society, vol. 135, No. 11, 1988, pp. 2835-2840.

Primary Examiner—Rolf Hille
Assistant Examiner—Steven Loke
Attorney, Agent, or Firm—Leydig, Voit & Mayer

[57] ABSTRACT

A compound semiconductor integrated circuit device has a region implanted with an impurity for forming a carrier capture level in an element isolating region in a semi-insulating compound semiconductor substrate. The region includes at least a first region of relatively low implantation concentration of the impurity and a second region of relatively high implantation concentration of the impurity.

9 Claims, 6 Drawing Sheets

FIG. 1
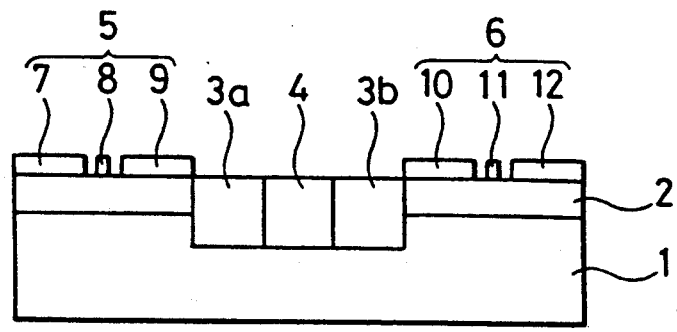
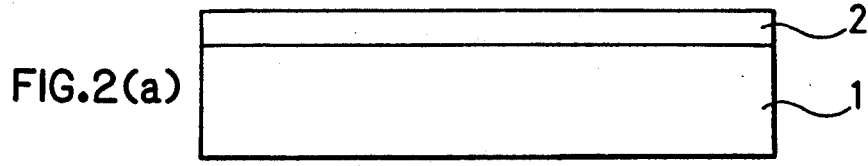
FIG.2(a)
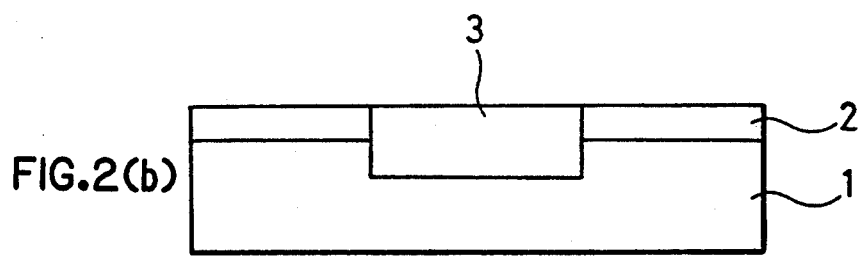
FIG.2(b)
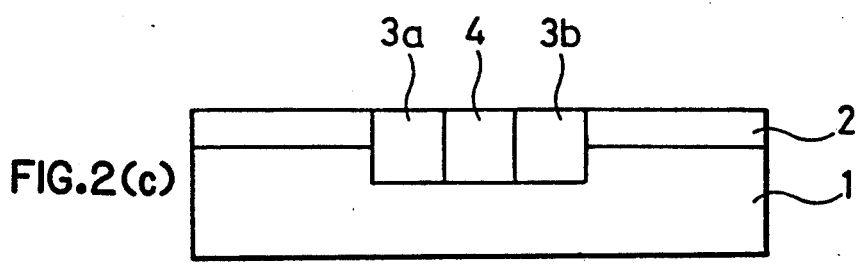
FIG.2(c)
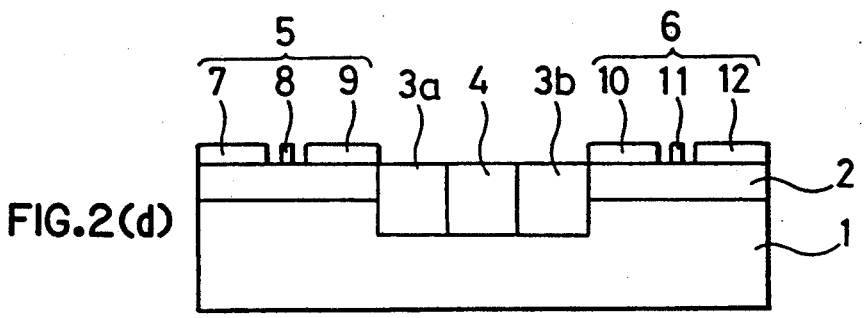
FIG.2(d)

COMPOUND SEMICONDUCTOR INTEGRATED CIRCUIT DEVICE WITH AN ELEMENT ISOLATING REGION

FIELD OF THE INVENTION

The present invention relates to a compound semiconductor integrated circuit device and, more particularly, to an improvement in isolation between elements formed therein.

BACKGROUND OF THE INVENTION

A description will be given of a conventional compound semiconductor integrated circuit device by using a GaAs integrated circuit device (referred to as a GaAsIC hereinafter) as one example.

FIG. 5 is a sectional view showing an example of a conventional GaAsIC with a part between elements in the center thereof. In FIG. 5, reference numeral 1 designates a semi-insulating GaAs substrate, reference numeral 2 designates an n type GaAs layer formed on the semi-insulating GaAs substrate 1 by epitaxial growth, reference numeral 16 designates a hydrogen ion implantation region formed in the n type GaAs layer 2 and the semi-insulating GaAs substrate 1 to isolate elements, reference numerals 5 and 6 designate field effect transistors (referred to as FET's hereinafter) formed in the GaAsIC, reference numerals 7 and 10 designate source electrodes of the FET's 5 and 6, respectively, reference numerals 8 and 11 designate gate electrodes of the FET's 5 and 6, respectively, and reference numerals 9 and 12 designate drain electrodes of the FET's 5 and 6, respectively.

FIGS. 6(a)-6(c) are sectional views showing an example of manufacturing flow to manufacture the GaAsIC shown in FIG. 5. The manufacturing flow will be described hereinafter.

First, as shown in FIG. 6(a), the n type GaAs layer (n layer) 2 is formed on the semi-insulating GaAs substrate 1 by epitaxial growth.

Then, as shown in FIG. 6(b), a desired amount of hydrogen ions are implanted between the element 5 and the element 6 (which are FET's in this case) to form a hydrogen ion implantation region 16. The resistance of the n type GaAs layer 2 in this hydrogen ion implantation region 16 is increased because carrier trapping centers are formed by ion implantation, so that this layer serves as a semi-insulating layer (i layer), whereby element isolation can be implemented.

Then, the source electrodes 7 and 10, the gate electrodes 8 and 11, and the drain electrodes 9 and 12 are formed in the FET's 5 and 6, respectively and these are wired. Thus, the GaAsIC is completed.

Isolation between elements is implemented in the conventional GaAsIC through the above-described manufacturing flow. A curve 13 shown in FIG. 3 shows an example of the voltage-current characteristic between elements in this case. When a voltage between elements is less than $V_{TF1}$ (called as a trap fill voltage), an ohmic current flows and resistance between elements is high. When it is more than $V_{TF1}$, current is abruptly increased and then resistance between the elements is also abruptly reduced, whereby leakage current is increased.

In addition, when a voltage of $V_{TF1}$ or more is applied between the elements, as a phenomenon particular to a compound semiconductor having a semi-insulating characteristic, a back gate effect, is generated by breakdown of the n-i-n structure and the isolated elements are mutually influenced, with the result that characteristics of the elements are lowered.

Furthermore, there is the negative correlation between the above described trap fill voltage $V_{TF1}$ and the resistance in the ohmic region in general as shown in FIG. 9. When the resistance in the ohmic region is increased by adjusting the implantation condition of hydrogen ions, the voltage $V_{TF1}$ is reduced and then the back gate effect is likely to be generated, with the result that it is not possible to keep both at appropriate values.

As described above, since it is not possible to keep both the resistance between elements and the trap fill voltage high in the conventional compound semiconductor integrated circuit device, the element characteristics are lowered because the leakage current is large or the elements are mutually influenced by the breakdown.

SUMMARY OF THE INVENTION

The present invention was made to solve the above problems and it is an object of the present invention to provide a compound semiconductor integrated circuit device having a structure in which the resistance between elements and the trap fill voltage are both kept high.

Other objects and advantages of the present invention will become apparatus from the detailed description given hereinafter; it should be understood, however, that the detailed description and specific embodiment are given by way of illustration only, since various changes and modifications within the spirit and scope of the invention will become apparent to those skilled in the art from this detailed description.

A compound semiconductor integrated circuit device in accordance with the present invention comprises a region implanted with impurity ions forming a carrier capture level in an element isolating region in a semi-insulating compound semiconductor substrate. The region comprises at least a first region comprising the impurity in low concentration and a second region comprising the impurity in a concentration higher than that of the first region.

According to the present invention, since impurity ions forming a carrier capture level are selectively implanted in the element isolating region in the semi-insulating compound semiconductor substrate and then a region comprising the impurity ions in low concentration and a region comprising the impurity ions in high concentration are formed, the resistance between elements is high in the low concentration impurity region and the trap fill voltage can be kept high in the high concentration impurity region, with the result that both the resistance between elements and the trap fill voltage can be high.

BRIEF DESCRIPTION OF THE DRAWINGS

FIG. 1 is a sectional view showing a compound semiconductor integrated circuit device with a part between elements thereof in accordance with a first embodiment of the present invention;

FIGS. 2(a)-2(d) are sectional views showing a manufacturing flow for manufacturing the compound semiconductor integrated circuit device shown in FIG. 1;

DETAILED DESCRIPTION OF PREFERRED EMBODIMENTS

An embodiment of the present invention will be described in detail hereinafter with reference to the drawings.

Figure 5:
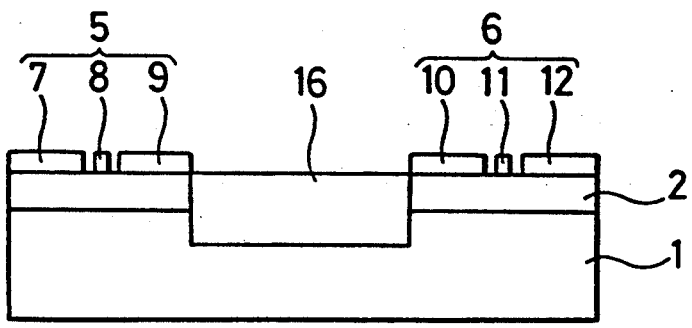
FIG. 5 is a sectional view showing a conventional compound semiconductor integrated circuit device with a part between elements thereof.
Figure 6A:
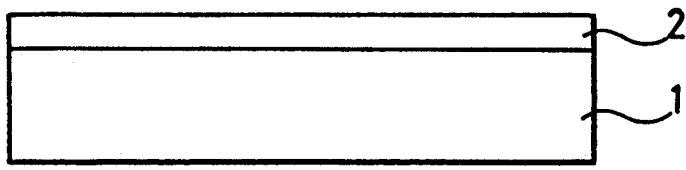
FIGS. 6(a)-6(c) are sectional views showing a manufacturing flow for manufacturing the compound semiconductor integrated circuit device shown in FIG. 5.
Figure 6B:
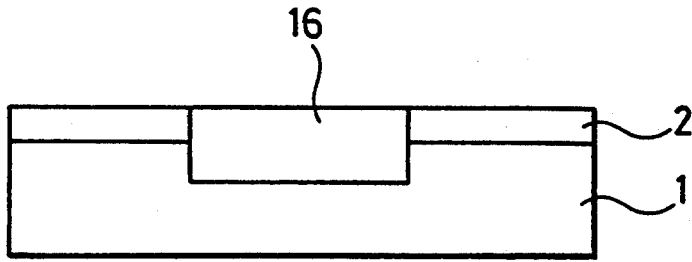
Figure 6C:
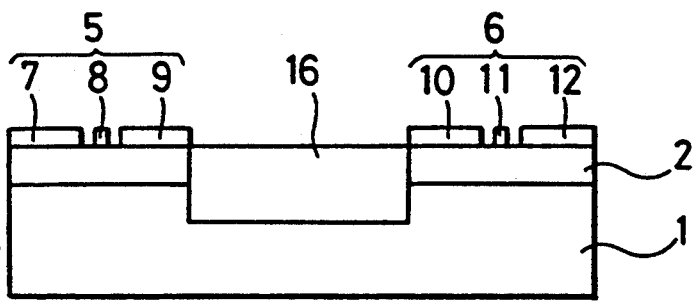

FIG. 1 is a sectional view showing a compound semiconductor integrated circuit device with a part between elements thereof in accordance with a first embodiment of the present invention. In FIG. 1, the same reference numbers are allotted to the same or corresponding elements as in FIG. 5. Reference numerals 3a and 3b designate impurity implantation regions in low concentration formed in an element isolating region adjacent to the elements, reference numeral 4 designates an impurity implantation region in high concentration formed between the low concentration impurity implantation regions 3a and 3b.

FIGS. 2(a)-2(d) are sectional views showing an example of manufacturing flow for manufacturing a GaAsIC shown in FIG. 1 with a part between elements thereof. The manufacturing flow is described hereinafter.

First, as shown in FIG. 2(a), an n type GaAs layer (n layer) 2 having carrier concentration of, for example $1 \times 10^{17}$ to $2 \times 10^{18}$ cm$^{-3}$ is formed on a semi-insulating GaAs substrate 1 by a method such as ion implantation or epitaxial growth.

Then, as shown in FIG. 2(b), an impurity implantation region 3 in low concentration is formed in an element isolation region between FET's 5 and 6 by implanting an insulating impurity, for example hydrogen ions, boron ions, or oxygen ions which forms a carrier capture level, so that the resistance between the elements may be maximized. Drawings will be referred to hereinafter, which are used in determining the implantation condition that maximized the resistance between elements.

Figure 3:
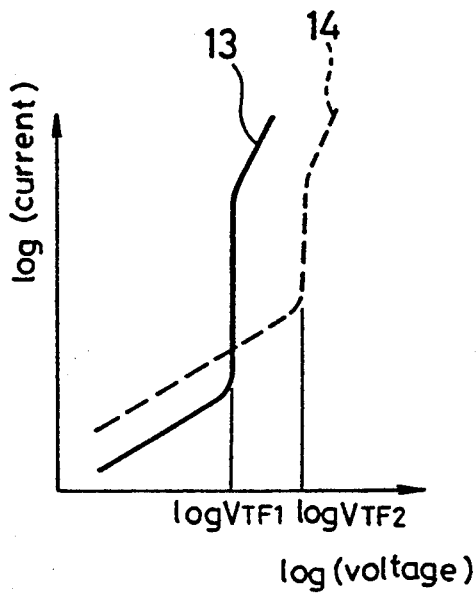
FIG. 3 is a graph of voltage-current characteristics in ion implantation regions.
Figure 7:
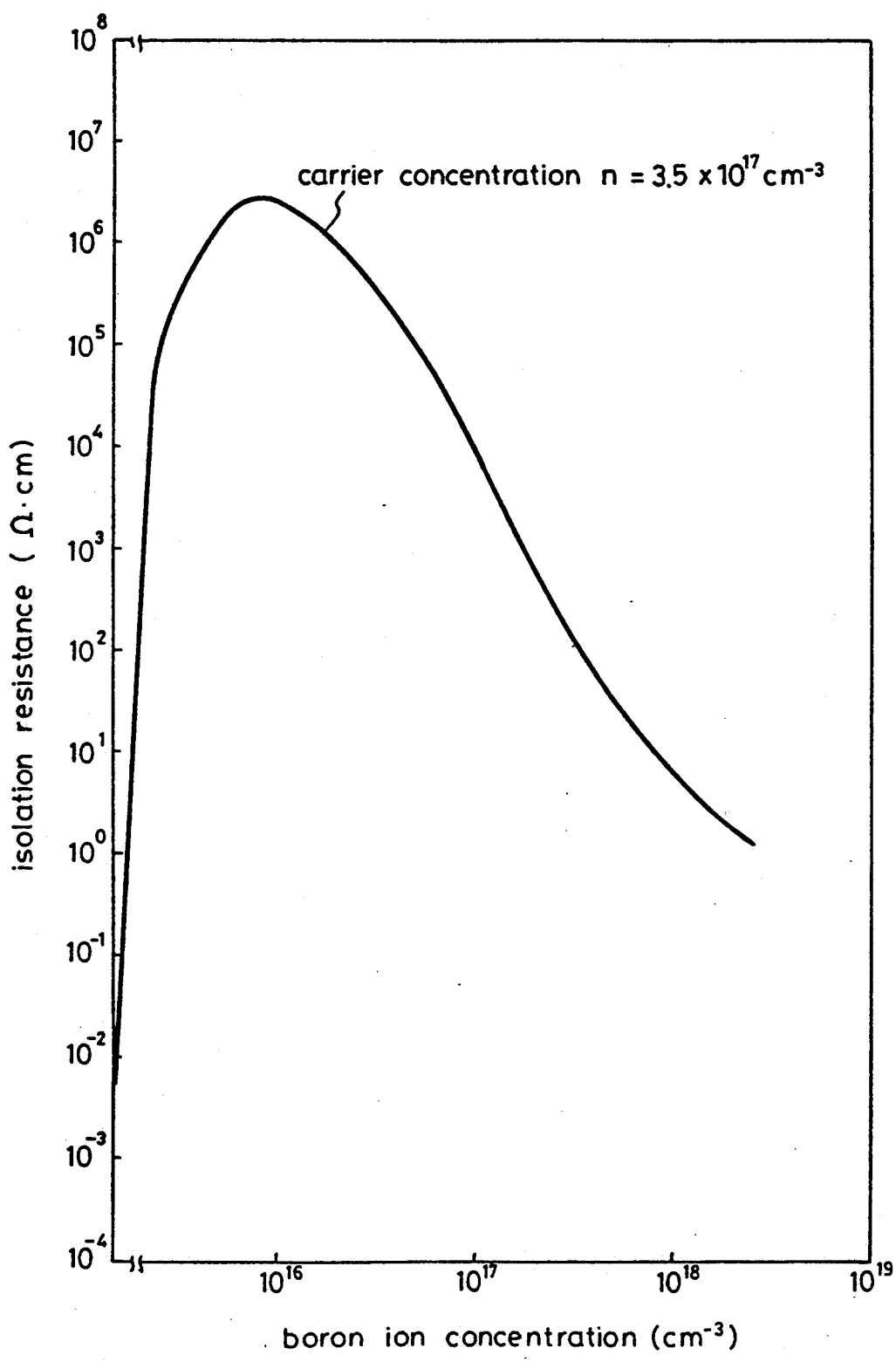
FIG. 7 is a view showing the relation between boron ion implantation concentration and isolation resistance.
Figure 8:
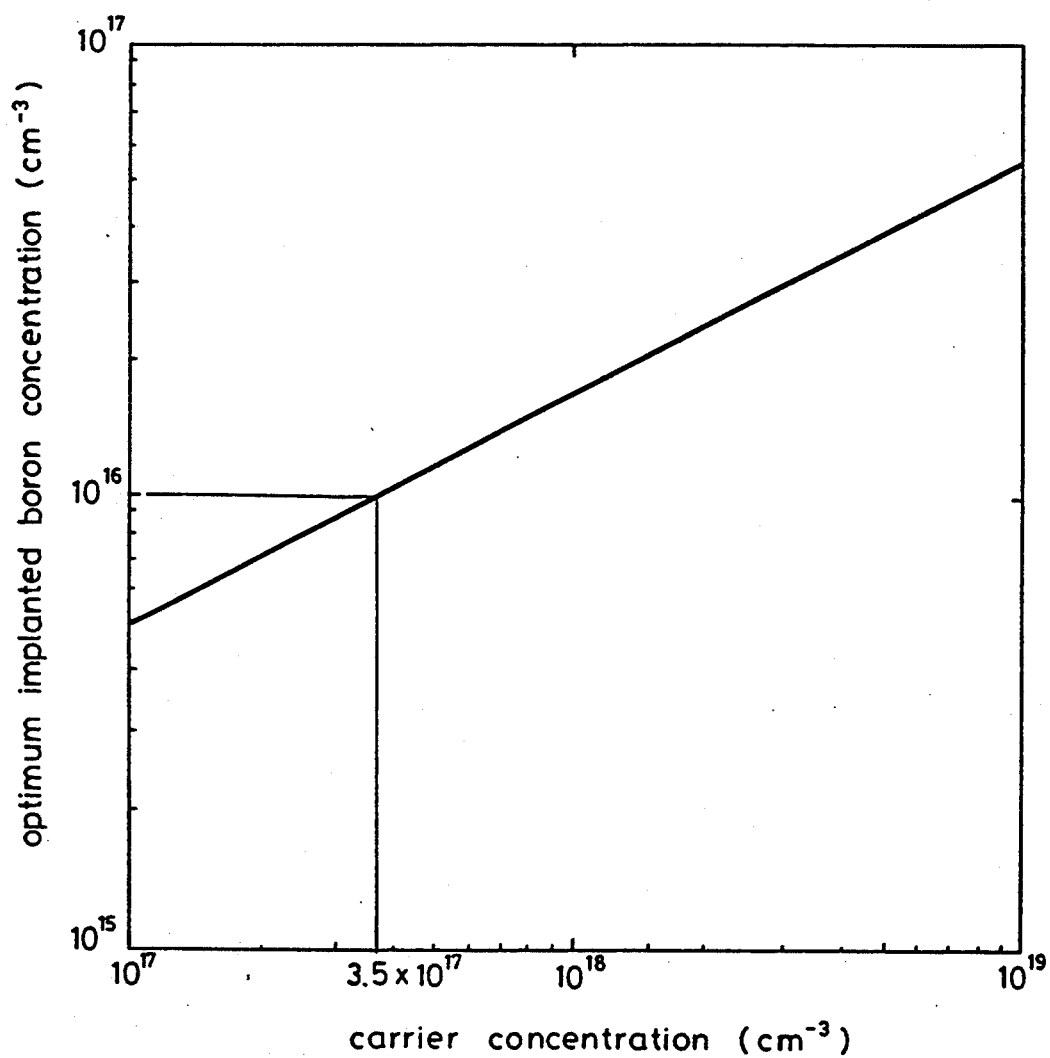
FIG. 8 is a view showing the relation between carrier concentration of an n layer and optimum implantation concentration of boron ions.
Figure 9:
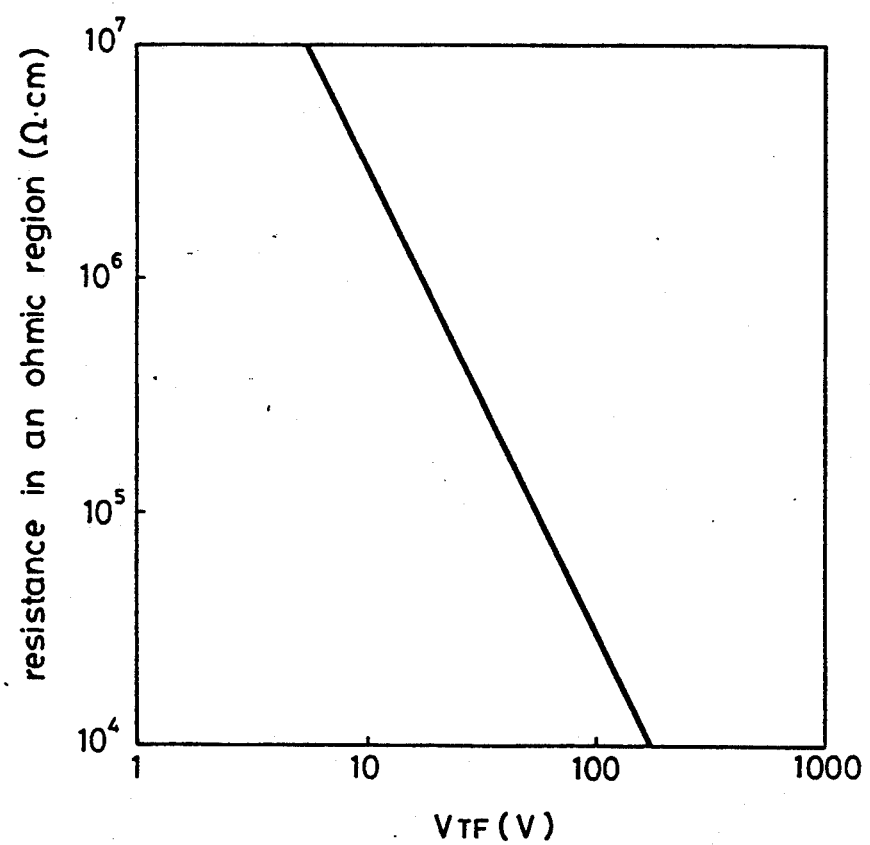
FIG. 9 is view showing the relation between a trap fill voltage $V_{TF}$ and resistance in an ohmic region.

That is, FIG. 7 shows the relation between implantation concentration of boron ions (boron ion concentration, cm$^{-3}$) and isolation resistance ($\Omega \cdot$ cm) when the carrier concentration of the n layer 2 is $3.5 \times 10^{17}$ cm$^{-3}$, and FIG. 8 shows the relation between the carrier concentration (cm$^{-3}$) of the n layer 2 and the optimum implantation concentration (cm$^{-3}$) of boron ion. As can be seen from FIG. 7, since the carrier trapping center is formed in an implantation region of low concentration the resistance of the n layer is increased in proportion to implantation concentration. However, hopping conduction occurred when the concentration exceeds a certain value and then the resistance decreases. If the n layer 2 has a carrier concentration of approximately $1 \times 10^{17}$ to $1 \times 10^{19}$ cm$^{-3}$ so as to be used for a normal IC, boron ion concentration should be approximately $1 \times 10^{15}$ to $1 \times 10^{17}$ cm$^{-3}$ in order to increase the resistance of the i layer 3. For example, when the carrier concentration of the n layer is $3.5 \times 10^{17}$ cm$^{-3}$, the resistance of the i layer 3 can be effectively increased by setting the boron ion concentration at approximately $1 \times 10^{16}$ cm$^{-3}$. In addition, since the relation between the implanted boron ion concentration and the isolation resistance shown in FIG. 7 is different depending on the carrier concentration of the n layer 2, the optimum implanted boron concentration should be determined in accordance with the carrier concentration in reference to FIG. 8. In addition, although boron ions are implanted in the above embodiment, if hydrogen ions are implanted to increase the resistance of the i layer as in the conventional example, the implantation amount should be set at approximately $1 \times 10^{13}$ to $1 \times 10^{14}$ cm$^{-2}$ and the implantation concentration should be set at approximately $1 \times 10^{17}$ to $1 \times 10^{19}$ cm$^{-3}$ for the normal IC. Then, as shown in FIG. 2(c), an impurity implantation region 4 in high concentration is formed by implanting an impurity only in the center part of the low concentration impurity implantation region 3. When boron ions are implanted, implantation concentration in implantation region 4 is approximately $1 \times 10^{17}$ to $1 \times 10^{19}$ cm$^{-3}$. On the other hand, when hydrogen ions are implanted, the implantation amount is approximately $1 \times 10^{14}$ to $1 \times 10^{16}$ cm$^{-2}$ and implantation concentration in implantation region 4 is $1 \times 10^{19}$ to $1 \times 10^{21}$ cm$^{-3}$. Likewise, when the implanted impurity ions are oxygen ions, the impurity concentration in impurity implantation region 3 is $10^{15}$ to $10^{17}$ cm$^{-3}$ and in the impurity implantation region 4 is $10^{17}$ to $10^{19}$ cm$^{-3}$. Resistance in the high concentration impurity implantation region 4 is reduced because hopping conduction occurs. However, the trap fill voltage $V_{TF}$ is increased because the element resistance is inversely proportional to the trap fill voltage as shown in FIG. 9. A curve 14 shown in FIG. 3 shows the voltage-current characteristic of the element isolating region having an impurity concentration corresponding to the high concentration impurity region, in which resistance in an ohmic region is reduced but the trap fill voltage $V_{TF2}$ is increased.

Then, after the high concentration implantation region 4 is formed, source electrodes 7 and 10, gate electrodes 8 and 11 and drain electrodes 9 and 12 are formed at the FET forming parts 5 and 6, respectively as shown in FIG. 2(d) and then they are wired. As a result, a GaAsIC is completed.

The compound semiconductor integrated circuit device in accordance with the present invention comprises a low concentration impurity region for keeping the resistance between elements high in the element isolating region and a high concentration impurity region for keeping the trap fill voltage high, so that leakage current between elements and mutual influence between elements can be reduced. As a result, it is possible to improve insulating resistance and voltage resistance between n-i-n layers in the i layer of the element isolating region sandwiched by the n layer 2.

Figure 4:
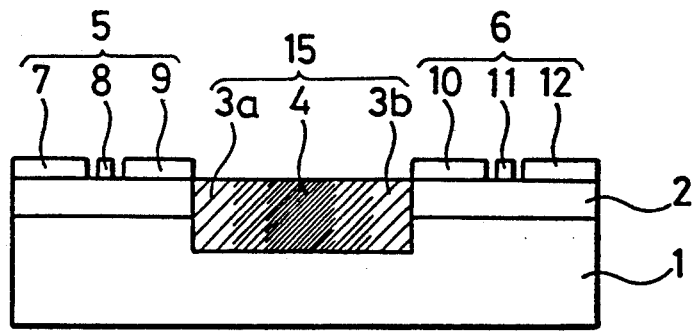
FIG. 4 is a sectional view showing a compound semiconductor integrated circuit device with a part between elements thereof in accordance with a second embodiment of the present invention.

In addition, although a description was given of a case where there are two kinds of impurity concentration regions in the element isolating region in the above embodiment of the present invention, even if there are more than two kinds of impurity concentration regions there, the same effect can be attained by appropriately selecting impurity concentrations. FIG. 4 is a sectional view showing a compound semiconductor integrated circuit device in accordance with a second embodiment of the present invention. In FIG. 4, the same reference numerals as in FIG. 1 designate the same parts. Reference numeral 15 designates a region having gradations of concentration formed by implanting an impurity such as hydrogen ions or boron ions in several stages.

In this case also, the concentration gradation region 15 has regions 3a and 3b having low impurity concentration to increase resistance between elements and a region 4 having high impurity concentration to increase the trap fill voltage, so that leakage current and a mutual influence between elements are reduced.

In addition, although the low impurity concentration regions 3a and 3b are formed at the sides of the FET's 5 and 6 and the high impurity concentration region 4 is formed therebetween in the element isolating region in the above embodiments, arrangement of the low impurity concentration regions 3a and 3b and the high impurity concentration region 4 is not so limited. For example, the high impurity concentration regions may be provided at the side of the FET's 5 and 6 and the low impurity concentration region arranged in the middle thereof or the high impurity concentration region and the low impurity concentration region may be alternatingly formed in the element isolating region. In brief, according to the present invention, there is at least one region having low impurity concentration to increase resistance between elements and one region having high impurity concentration to increase the trap fill voltage in the element isolating region and the structure is not limited to those shown in the above embodiments.

Although, hydrogen ions, boron ions, oxygen ions and the like are shown as an impurity to be implanted in the element isolating region in the above embodiments, another ion can be used if a carrier capture level can be formed by implantation, whereby a highly resistive layer or semi-insulating layer (i layer) is formed.

In addition, although a description was given of GaAsIC in the above embodiments, even if another semi-insulating compound semiconductor material such as AlGaAs or InP is used, the same effect can be obtained.

As described above, according to the present invention, since a region comprising the impurity ions in low concentration and a region comprising the impurity ions in high concentration are formed in an element isolating region in a semi-insulating compound semiconductor substrate by selectively implanting impurity ions which form a carrier capture level, the resistance between elements can be high in the low concentration impurity region and the trap fill voltage can be kept high in the high concentration impurity region, whereby both resistance between elements and the trap fill voltage can be kept high. As a result, there can be provided a compound semiconductor integrated circuit device with high performance in which leakage current between elements is small and also a mutual influence between elements is small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A compound semiconductor integrated circuit device comprising:
   a GaAs semi-insulating substrate;
   two electronic elements spaced apart in said semi-insulating substrate; and
   an element isolating region in the substrate between said electronic elements implanted with hydrogen forming a carrier capture level, said element isolating region comprising a first region having a hydrogen concentration in a range from $1 \times 10^{17}$ to $1 \times 10^{19}$ cm$^{-3}$ and a second region having a hydrogen concentration in a range from $1 \times 10^{19}$ to $1 \times 10^{21}$ cm$^{-3}$ and separated from said electronic elements by said first region.

2. A compound semiconductor integrated circuit device in accordance with claim 1 wherein said element isolating region includes two of said first regions, one of said first regions being disposed adjacent to each of said electronic elements and wherein said second region is disposed between and separated from said electronic elements by said two first regions.

3. A compound semiconductor integrated circuit device in accordance with claim 1 wherein said first region and said second region include impurity concentration gradients.

4. A compound semiconductor integrated circuit device comprising:
   a GaAs semi-insulating substrate;
   two electronic elements spaced apart in said semi-insulating substrate; and
   an element isolating region in the substrate between said electronic elements implanted with boron forming a carrier capture level, said element isolating region comprising a first region having a boron concentration in a range from $1 \times 10^{15}$ to $1 \times 10^{17}$ cm$^{-3}$ and a second region having a boron concentration in a range from $1 \times 10^{17}$ to $1 \times 10^{19}$ cm$^{-3}$ and separated from said electronic elements by said first region.

5. A compound semiconductor integrated circuit device in accordance with claim 4 wherein said element isolating region includes two of said first regions, one of said first regions being disposed adjacent to each of said electronic elements and wherein said second region is disposed between and separated from said electronic elements by said two first regions.

6. A compound semiconductor integrated circuit device in accordance with claim 4 wherein said first region and said second region include impurity concentration gradients.

7. A compound semiconductor integrated circuit device comprising:
   a GaAs semi-insulating substrate;
   two electronic elements spaced apart in said semi-insulating substrate; and
   an element isolating region in the substrate between said electronic elements implanted with oxygen forming a carrier capture level, said element isolating region comprising a first region having a oxygen concentration in an range from $1 \times 10^{15}$ to $1 \times 10^{17}$ cm$^{-3}$ and a second region having an oxygen concentration in a range from $1 \times 10^{17}$ to $1 \times 10^{19}$ cm$^{-3}$ and separated from said electronic elements by said first region.

8. A compound semiconductor integrated circuit device in accordance with claim 7 wherein said element isolating region includes two of said first regions, one of said first regions being disposed adjacent to each of said electronic elements and wherein said second region is disposed between and separated from said electronic elements by said two first regions.

9. A compound semiconductor integrated circuit device in accordance with claim 7 wherein said first region and said second region include impurity concentration gradients.

* * * * *